United States Patent [19]

Edwards

[11] Patent Number: 4,730,274

[45] Date of Patent: Mar. 8, 1988

[54] NON-VOLATILE MEMORY WITH PREDICTABLE FAILURE MODES AND METHOD OF DATA STORAGE AND RETRIEVAL

[75] Inventor: Colin W. Edwards, Chalfont St. Peter, England

[73] Assignee: Hughes Aircraft Company, Los Angeles, Calif.

[21] Appl. No.: 832,112

[22] Filed: Feb. 24, 1986

[30] Foreign Application Priority Data

Feb. 27, 1985 [GB] United Kingdom ................. 8505081

[51] Int. Cl.$^4$ ............................................. G11C 11/00
[52] U.S. Cl. .................................... 365/156; 365/185
[58] Field of Search ............... 365/154, 156, 182, 185, 365/229, 184, 189

[56] References Cited

U.S. PATENT DOCUMENTS 4,354,255 10/1982 Stewart .............................. 365/154

FOREIGN PATENT DOCUMENTS

| 0048814 | 4/1982 | European Pat. Off. . |
| 1482114 | 8/1977 | United Kingdom . |
| 2000407 | 1/1979 | United Kingdom . |
| 1544314 | 4/1979 | United Kingdom . |
| 1556528 | 11/1979 | United Kingdom . |
| 2054303 | 2/1981 | United Kingdom . |
| 2063601 | 6/1981 | United Kingdom . |
| 2093302 | 8/1982 | United Kingdom . |
| 2104748 | 3/1983 | United Kingdom . |

OTHER PUBLICATIONS

H. H. Chao, IBM Technical Disclosure Bulletin, "Static RAM with Nonvolatile Back Up Memory", Oct. 1981, pp. 2456–2457.

Primary Examiner—Joseph A. Popek
Attorney, Agent, or Firm—Kenneth W. Float; A. W. Karambelas

[57] ABSTRACT

A non-volatile memory device comprising a volatile memory and a non-volatile memory. The volatile memory comprises a volatile memory circuit, such as a D-type cell, or the like, which incorporates a data input, a volatile storage circuit for storing Q and $\overline{Q}$ output signals, and Q and $\overline{Q}$ data outputs. The non-volatile memory comprises circuitry which selectively stores a predetermined one of the Q and $\overline{Q}$ output signals, and which selectively transfers the stored signal to the volatile memory. The non-volatile memory may comprise, for example, a FATMOS transistor, or the like, and control circuitry coupled thereto. The non-volatile memory also includes transistor circuitry coupled between a voltage source and the FATMOS transistor, for example, which selectively controls the storage and transfer of signals between the non-volatile memory circuit and the volatile storage circuit in conjunction with signals applied to the control circuitry. This device may be employed as a fail-safe switching device due to the nature of the failure modes of the non-volatile memory. A method of data storage and retrieval is also disclosed.

18 Claims, 1 Drawing Figure

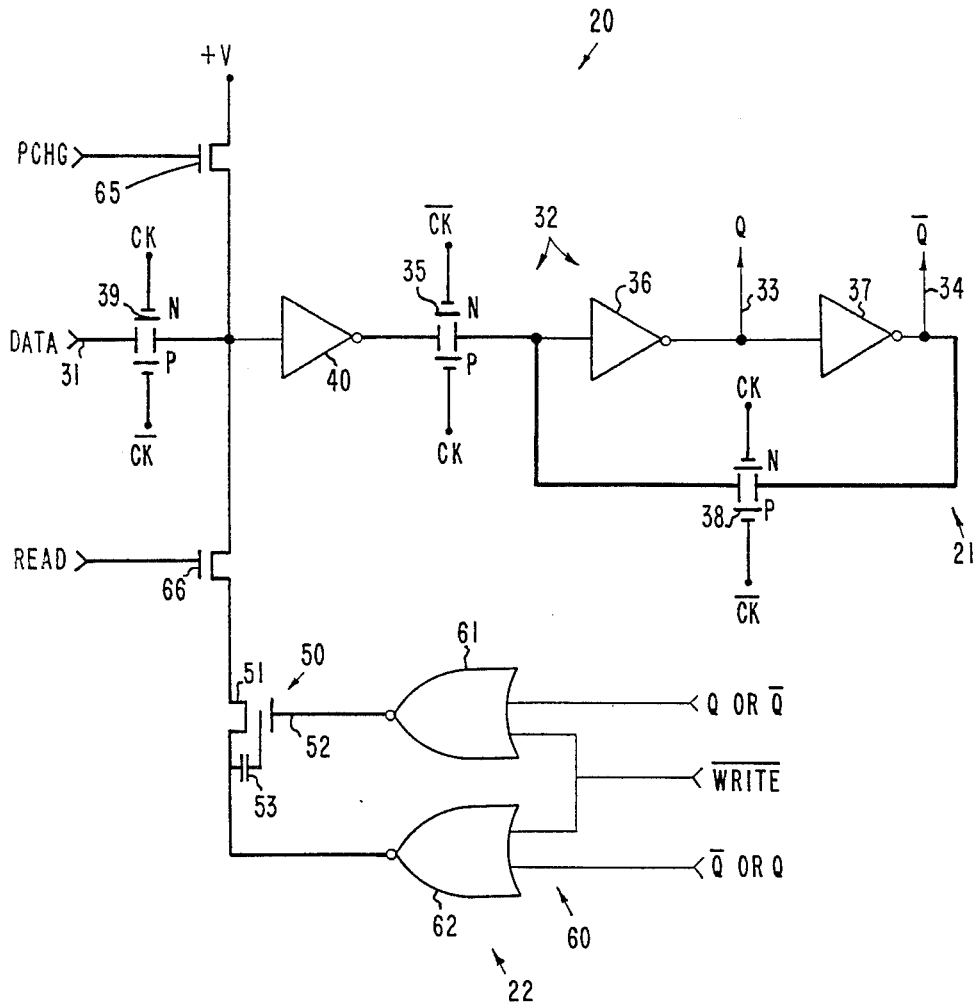

NON-VOLATILE MEMORY WITH PREDICTABLE FAILURE MODES AND METHOD OF DATA STORAGE AND RETRIEVAL

BACKGROUND OF THE INVENTION

The present invention relates generally to memory cells, such as D-type flip flops, and the like, and more particularly to non-volatile memory cells which have predictable failure modes. The present invention also relates to a method of data storage and retrieval which may be employed to provide for the non-volatile storage and retrieval of data.

Semiconductor memories can generally be divided into two groups—volatile and non-volatile. The first group employs dynamic or static logic elements and techniques to store data in a pattern which can be changed by the application of external signals. One problem with this first group is that memory storage is volatile, in that power must be constantly applied to the memory cell to avoid loss of data.

The second group of memories relies on special MOS devices to retain information for very long periods of time, on the order of tens of years, even with power removed. This retention is usually achieved by application of high voltages to the gates of specially constructed transistors. This operation creates a semi-permanent change in the transistor threshold voltage which results in trapping of electric charge therein. Typical of this group of transistors are Metal-Nitride-Oxide-Semiconductor (MNOS), Floating-Gate Avalanche-Injection MOS (FAMOS) and Floating-Gate Avalanche-Injection Thin-Oxide MOS (FATMOS) transistors, and the like.

To obtain a more detailed understanding of these memory cells and the devices employed therein, reference is made to U.S. Pat. Nos. 4,132,904 and 4,175,290 which discuss volatile and non-volatile memory cells in some detail.

One particular non-volatile memory cell is the D-type cell, as it is known in the art. This memory cell is a conventional memory cell and is described in detail in a publication entitled "CMOS Data Book," published by National Semiconductor Corporation, and having publication number B-F-2087 DA-RRD125M611. The particular device of interest is device number 4013 entitled "Dual Type D Flip Flop." This logic cell is somewhat similar to a conventional J-K flip-flop and is a standard logic component.

The D-type cell may typically employ gate/inverter pairs to store data signals. This design scheme is shown in the CMOS 4013 memory cell specification cited above. As mentioned above, although data signals can be stored in this cell, when power is removed, the data is lost.

SUMMARY OF THE INVENTION

In order to overcome the above-cited and other limitations of prior art volatile memory cell designs, including D-type cell designs, and the like, the present invention provides for an improvement to volatile memory cell designs which transforms them into a non-volatile memory cell. For example, the D-type cell is a volatile memory cell comprising a data input, a volatile storage circuit for storing Q and $\overline{Q}$ output signals, and Q and $\overline{Q}$ data outputs.

The improvement provided by the present invention comprises a non-volatile memory coupled to the volatile memory cell which selectively stores a predetermined one of the Q and $\overline{Q}$ output signals, and which selectively transfers the stored signal to the volatile memory cell.

The non-volatile memory comprises a FATMOS transistor, or the like, and control circuitry coupled thereto. The non-volatile memory also includes transistor circuitry coupled between a voltage source and the FATMOS transistor for selectively controlling the storage and transfer of signals between the non-volatile memory and the volatile memory cell.

The transistor circuitry comprises first and second transistors serially coupled between the voltage source and the FATMOS transistor. The first transistor is adapted to selectively charge the drain of the FATMOS transistor to a high level which permits the transfer of the stored signals to the memory cell. The second transistor is adapted to selectively transfer the stored signals to the volatile memory cell in conjunction with the charging of the first transistor in response to the application of a READ control voltage applied thereto.

The control circuitry comprises a plurality of NAND gates having respective first inputs coupled to the Q and $\overline{Q}$ data outputs of the memory cell. The NAND gates have respective second inputs coupled to a WRITE control voltage, and outputs coupled to the gate and source electrodes of the FATMOS transistor, respectively.

The operation of the memory cell of the present invention is easily understood and may be readily appreciated. Data signals are sequentially clocked into the volatile memory through the data input. For example, gate/inverter pairs may be employed in the volatile memory to store the applied data signal and its complement (Q, $\overline{Q}$) until new data is clocked into the memory cell or power is removed.

When a particular data signal is to be stored in the FATMOS transistor, a WRITE voltage is applied to the control circuitry. The data in the memory cell is loaded into the FATMOS transistor for permanent retention. When stored data is to be read from the FATMOS transistor into the memory cell, the first and second transistors are sequentially made conducting which transfers the stored data from the FATMOS transistor to the memory cell.

The FATMOS transistor has a natural enhancement threshold, in that without any charge on the floating gate, and with the gate and source electrodes grounded, the transistor is non-conducting. Because the tunnel is between the floating gate and source electrodes, any defect in the FATMOS transistor except leakage from the drain electrode to the gate electrode will cause the transistor to be non-conducting. Therefore, the non-conducting state can be defined as the fail safe state. The memory cell of the present invention can only enter the conducting state when programmed into depletion and when free of failure modes. Consequently, the present invention may be employed in devices requiring fail-safe switching operation.

In addition to the above-described memory circuit, the present invention also contemplates a method of data storage and retrieval. The method comprises the steps of applying a data signal to an input of a volatile memory cell. The second step involves storing the data signal and its complement in the volatile memory cell. The third step comprises applying the data signal and its complement to inputs of a non-volatile memory cell.

The fourth step involves selectively storing either the data signal or its complement in the non-volatile memory cell. The final step comprises selectively applying the signal stored in the non-volatile memory cell to the volatile memory cell for storage therein.

Alternatively, the method of the present invention may comprise a method of data storage comprising the steps of applying a data signal to an input of a volatile memory cell. The second step involves storing the data signal and its complement in the volatile memory cell. The third step comprises applying the data signal and its complement to inputs of a non-volatile memory cell. The fourth step involves selectively storing either the data signal or its complement in the non-volatile memory cell. An additional step dealing with data retrieval comprises selectively applying the signal stored in the non-volatile memory cell to the volatile memory cell for storage therein.

BRIEF DESCRIPTION OF THE DRAWING

The various features and advantages of the present invention may be more readily understood with reference to the following detailed description taken in conjunction with the accompanying drawing, wherein like reference numerals designate like structural elements, and in which:

The single FIGURE illustrates an embodiment of a non-volatile memory cell in accordance with the principles of the present invention.

DESCRIPTION OF THE PREFERRED EMBODIMENTS

Referring to the FIGURE, an embodiment of a non-volatile memory cell 20 in accordance with the principles of the present invention is shown. The embodiment of the memory cell 20 shown in the FIGURE is a non-volatile version of a D-type cell, as it is commonly known in the art.

The memory cell 20 comprises a volatile portion and a non-volatile portion. The volatile portion is a volatile memory 21 comprising a data input 31, a volatile storage circuit 32 for storing Q and $\overline{Q}$ output signals, and Q and $\overline{Q}$ data outputs 33, 34. The volatile memory 21 employs a plurality of gates and inverters in a paired arrangement which comprises a first gate 35 and first inverter 36 and a second gate 38 and second inverter 37. In addition, the volatile memory 21 has an input gate 39 and input inverter 40 coupled between the data input 31 and the volatile storage circuit 32. Clock signals derived from a clock generator (not shown), including clock and clock complement signals (CK, $\overline{CK}$) are coupled to the gates 35, 38, 39 which are employed to transfer data signals through the circuit. A typical clock circuit is shown in the specification of the CMOS 4013 flip flop cited above.

The improvement provided by the present invention comprises a non-volatile memory circuit 22 which includes a non-volatile memory and control circuitry coupled to the volatile memory 21. The non-volatile memory circuit 22 is adapted to selectively store a predetermined one of the Q and $\overline{Q}$ output signals, and selectively transfer stored signals to the volatile memory cell 21.

The non-volatile memory circuit 22 comprises a FATMOS transistor 50 and control circuitry 60 coupled thereto. The FATMOS transistor 50 has drain, source and floating poly-gate electrodes 51, 52, 53, respectively. The drain electrode 51 is coupled to the input of the input inverter 40, while the source and floating gate electrodes 52, 53 are coupled to the control circuitry 60. The non-volatile memory circuit 22 also includes transistor circuitry coupled to a voltage source (not shown) and the drain electrode 51 of the FATMOS transistor 50 which selectively controls the storage and transfer of signals between the non-volatile memory 22 and the volatile memory cell 21.

The design, construction and operation of the FATMOS transistor 50 is generally well known in the art. By way of example, a FATMOS logic circuit is described in U.S. Pat. No. 4,132,904, entitled "Volatile/Non-volatile Logic Latch Circuit." Particularly relevant to an understanding of the present invention is the discussion regarding FIGS. 3, 3a and 14.

The transistor circuitry comprises first and second transistors 65, 66 serially coupled between the voltage source and the drain electrode 51 of the FATMOS transistor 50. The first transistor 65 is adapted to selectively charge the drain electrode 51 of the FATMOS transistor 50 to a high level in order to permit the transfer of the stored signals to the volatile memory 21. The second transistor 66 is adapted to selectively transfer the stored signals to the volatile memory 21 in conjunction with the charging of the first transistor 65 in response to the application of a READ control voltage applied thereto.

The control circuitry 60 comprises a plurality of NAND gates 61, 62, for example, having respective first inputs thereof coupled to the Q and $\overline{Q}$ data 33, 34 outputs of the volatile memory 21. The NAND gates 61, 62 have respective second inputs coupled to a WRITE control voltage source (not shown), and outputs respectively coupled to the gate and source electrodes 53, 52 of the FATMOS transistor 50.

Although not specifically shown in the FIGURE, the gates and inverters are each coupled to an appropriate voltage source and to ground in a conventional manner. The voltages required for the circuits shown in the FIGURE are well-known in the circuit design art.

In operation, the memory cell 20 of the present invention functions as follows. Data signals are sequentially clocked into the volatile memory 21 through the data input 31. The gate/inverter pairs in the volatile memory circuit 22 stored the applied data signal and its complement (Q, $\overline{Q}$) until new data is clocked into the memory cell 20 or power is removed.

More specifically, the gates 35, 38, 39 are known as transmission gates which are constructed with N- and P-channel enhancement mode transistors. The operation of these gates is well-known in the art, but their operation will be outlined below for completeness. For reference, the CMOS 4013 flip flop cited above employs this type of gate and the operating characteristics thereof are described in the CMOS Data Book.

By way of example, and referring to the FIGURE, the input gate 39 may have its N- and P-channel transistors coupled to the CK and $\overline{CK}$ inputs as shown. The input gate 39 transfers an applied data signal to the input of the gate 38 on the rising edge of a positive-going clock pulse. At this time both the N- and P-channel transistors of the input gate 39 are made conducting. At the same time, the gate 35 is made non-conducting and the gate 38 is made conducting. Upon the occurence of the falling edge of the CK and $\overline{CK}$ clock pulses, gate 35 is made conducting while gates 38 and 39 are made non-conducting. Consequently, the applied data signal is sequentially moved into the storage region of the volatile memory cell 22 and retained there until the next clock pulse.

When a particular data signal is to be stored in the FATMOS transistor 50, a WRITE voltage is applied to the NAND gates 61, 62 of the control circuitry 60. The data in the volatile memory circuit 21 is loaded into the FATMOS transistor 50 for permanent retention. When stored data is to be read from the FATMOS transistor 50 into the volatile memory 21, the first and second transistors 65, 66 are sequentially made conducting by applying PCHG (percharge) and READ voltages respectively thereto, which causes the transfer of stored data from the FATMOS transistor 50 to the volatile memory 21. In addition, data may be "trapped" in the volatile memory circuit 21 and written to the FATMOS transistor 50 at a later time for storage thereof.

As regards the specifics of the READ and WRITE voltages and timing, the READ operation can read non-volatile data from the non-volatile memory circuit 22 at normal CMOS operating voltages. These voltages are typically 3 to 15 volts DC. The READ operation is performed without degradation of the non-volatile data stored in the FATMOS transistor 50. A typical READ operation is performed in less than one microsecond.

The WRITE operation employs voltages and timing which must be closely controlled to optimize the performance of the FATMOS transistor 50. Typically, the voltage is held at 13 volts and the timing is performed in 10 milliseconds. Accordingly, the transfer for the WRITE operation is long compared with volatile memories.

The FATMOS transistor 50 has a natural enhancement threshold, in that without any charge on the floating gate electrode 53, and with the gate and source electrodes 53, 52 grounded, the FATMOS transistor 50 is non-conducting. Because the tunnel is between the floating gate and source electrodes 53, 52, any defect in the FATMOS transistor 50 except leakage from the drain electrode 51 to the gate electrode 53 will cause the FATMOS transistor 50 to be non-conducting. Therefore, the non-conducting state can be defined as the fail safe state. The choice of Q and $\overline{Q}$ input signals (or their complement $\overline{Q}$ and Q) to the control circuit 60 determines the fail safe state.

Typical of faults that might occur are thin oxide breakdown in the tunnel region, leakage in the poly gate region, and closure of the threshold window at the end of cell life. The memory cell 20 of the present invention can only enter the conducting state when programmed into depletion and when free of failure modes. Consequently, the present invention may be employed in devices requiring fail-safe switching operation.

The present invention also contemplates a method of data storage and retrieval. The discussion hereinabove with reference to the operation of the circuit of the accompanying FIGURE alluded to a data storage and retrieval method, but did not outline the steps thereof in any explicit detail. Accordingly, one method in accordance with the principles of the present invention is outlined below.

The method involves the storage and retrieval of selected data or data complement signals. The first step in this method comtemplates applying a data signal to an input of a volatile memory cell. The next step involves storing the data signal and its complement in the volatile memory cell. The third step comprises applying the data signal and its complement to inputs of a non-volatile memory cell. The fourth step involves selectively storing one of the data and complement signals in the non-volatile memory cell. The final step comprises selectively applying the signal stored in the non-volatile memory cell to the volatile memory cell for storage therein.

Alternatively, the method of the present invention may comprise a method of data storage comprising the steps of applying a data signal to an input of a volatile memory cell. The third step comprises applying storing the data signal and its complement in the volatile memory cell. The third step comprises applying the data signal and its complement to inputs of a non-volatile memory cell. The fourth step involves selectively storing either the data signal or its complement in the non-volatile memory cell. An additional step dealing with data retrieval comprises selectively applying the signal stored in the non-volatile memory cell to the volatile memory cell for storage therein.

Thus, there has been described a new and improved non-volatile memory cell which may be employed as a fail-safe switching device, or the like. Although the present invention has been described with reference to the use of a FATMOS transistor as the principle non-volatile storage device, the present invention is not limited only to this device. As mentioned in the background, various other non-volatile storage devices are available which could be adapted to provide the non-volatile storage capability of the present invention. Also, the principles of the present invention may be applied to volatile memory cells other than D-type cells, and hence is not strictly limited thereto. In addition, a method of non-volatile data storage and retrieval has been disclosed.

It is to be understood that the above-described embodiment and method are merely illustrative of some of the many specific embodiments which represent applications of the principles of the present invention. Clearly, numerous and varied other arrangements may be readily devised by those skilled in the art without departing from the spirit and scope of the invention.

What is claimed is:

1. A method of data storage and retrieval comprising the steps of:
   applying a data signal to an input of a volatile memory cell;
   storing the data signal and its complement in said volatile memory cell;
   applying said data signal and its complement to inputs of a non-volatile memory cell comprising a FATMOS transistor and control circuitry coupled thereto, said FATMOS transistor having drain, source and floating gate electrodes said drain electrode being coupled to said volatile memory cell, said source and floating gate electrodes being coupled to said control circuitry;
   selectively storing one of said data and complement signals in said non-volatile memory cell: and
   selectively applying the signal stored in said non-volatile memory cell to said volatile memory cell for storage therein.

2. The method of claim 1 wherein said step of selectively storing one of said data and complement signals in said non-volatile memory cell comprises:
   applying a predetermined WRITE voltage to said control circuitry, said control circuitry providing predetermined voltages to said source and floating gate electrodes of said FATMOS transistor to cause the selective storing of one of said data and complement signals in said non-volatile memory cell.

3. The method of claim 2 wherein said step of selectively applying the signal stored in said non-volatile memory cell to said volatile memory cell comprises:
sequentially applying predetermined voltages to first and second transistors comprising said control circuitry coupled to the drain of said FATMOS transistor and the input to said volatile memory cell which application of said predetermined voltages READ's the signal stored in said non-volatile memory cell into said volatile memory cell.

4. The method of claim 1 wherein said step of selectively applying the signal stored in said non-volatile memory cell to said volatile memory cell comprises:
sequentially applying predetermined voltages to first and second transistors comprising said control circuitry coupled to the drain of said FATMOS transistor and the input to said volatile memory cell which application of said predetermined voltages READ's the signal stored in said non-volatile memory cell into said volatile memory cell.

5. A method of data storage and retrieval utilizing volatile memory means and non-volatile memory means, said method comprising the steps of:
applying a data signal to an input of said volatile memory means;
storing the data signal and its complement in said volatile memory means;
applying said data signal and its complement to inputs of non-volatile storage means comprising a FATMOS transistor and control circuitry coupled thereto, said FATMOS transistor having drain, source and floating gate electrodes, said drain electrode being coupled to said volatile memory means, said source and floating gate electrodes being coupled to said control circuitry;
selectively storing one of said data and complement signals in said non-volatile memory means; and
selectively applying the signal stored in said non-volatile memory means to said volatile memory means for storage therein.

6. The method of claim 5 wherein said step of selectively storing one of said data and complement signals in said non-volatile memory means comprises:
applying a predetermined WRITE voltage to said control circuitry, said control circuitry providing predetermined voltages to said source and floating gate electrodes of said FATMOS transistor to cause the selective storing of one of said data and complement signals in said non-volatile memory means.

7. The method of claim 6 wherein said step of selectively applying the signal stored in said non-volatile memory means to said volatile memory means comprises:
sequentially applying predetermined voltages to first and second transistors comprising said control circuitry coupled to the drain of said FATMOS transistor and the input to said volatile memory means which application of said predetermined voltages READ's the signal stored in said non-volatile memory means into said volatile memory means.

8. A method of data storage utilizing volatile memory means and non-volatile memory means, said method comprising the steps of:
applying a data signal to an input of said volatile memory means;
storing the data signal and its complement in said volatile memory means;
applying said data signal and its complement to inputs of non-volatile storage means comprising a FATMOS transistor and control circuitry coupled thereto, said FATMOS transistor having drain, source and floating gate electrodes, said drain electrode being coupled to said volatile memory means, said source and floating gate electrodes being coupled to said control circuitry; and
selectively storing one of said data and complement signals in said non-volatile memory means.

9. The method of claim 8 which further comprises the step of:
selectively applying the signal stored in said non-volatile memory means to said volatile memory means for storage therein.

10. The method of claim 8 wherein said step of selectively storing one of said data and complement signals in said non-volatile memory means comprises:
applying a predetermined WRITE voltage to said control circuitry, said control circuitry providing predetermined voltages to said source and floating gate electrodes of said FATMOS transistor to cause the selective storing of one of said data and complement signals in said non-volatile memory means.

11. In a volatile memory comprising a data input, volatile storage means for storing Q and $\overline{Q}$ output signals, and Q and $\overline{Q}$ data outputs, wherein the improvement comprises:
non-volatile memory means, comprising a FATMOS transistor and control circuitry coupled thereto, coupled to said volatile memory, for selectively storing a predetermined one of said Q and $\overline{Q}$ output signals, and for selectively transferring said stored signal to said volatile memory, said FATMOS transistor comprises drain, source and floating gate electrodes, said drain electrode being coupled to said volatile storage means, said source and floating gate electrodes being coupled to said control circuitry.

12. In a volatile memory comprising a data input, volatile storage means for storing Q and $\overline{Q}$ output signals, and Q and $\overline{Q}$ data outputs, wherein the improvement comprises:
non-volatile memory means comprising a FATMOS transistor and control circuitry coupled thereto, for selectively storing a predetermined one of said Q and $\overline{Q}$ output signals, and for selectively transferring said stored signal to said volatile memory, said non-volatile memory means further comprising transistor means coupled to a voltage source and the drain electrode of said FATMOS transistor for selectively controlling the storage and transfer of signals between said non-volatile memory means and said volatile memory.

13. The memory cell of claim 12 wherein said transistor means comprises:
first and second transistor means serially coupled between said voltage source and said FATMOS transistor, said first transistor means being adapted to selectively charge the drain of said FATMOS transistor to a high level in order to permit the transfer of said stored signals to said volatile memory, said second transistor means being adapted to selectively transfer said stored signals to said volatile memory in conjunction with the charging of said first transistor means in response to the application of a READ control voltage applied thereto.

14. The memory of claim 13 wherein said control circuitry comprises:
a plurality of NAND gates having respective first inputs thereof coupled to said Q and $\overline{Q}$ data outputs and having respective second inputs thereof coupled to a WRITE control voltage, said NAND gates having outputs coupled to the gate and source electrodes of said FATMOS transistor, respectively.

15. In a volatile memory comprising a data input, volatile storage means for storing Q and $\overline{Q}$ output signals, and Q and $\overline{Q}$ data outputs, wherein the improvement comprises:
non-volatile memory means comprising a FATMOS transistor and control circuitry coupled thereto, for selectively storing a predetermined one of said Q and $\overline{Q}$ output signals, and for selectively transferring said stored signal to said volatile memory, said FATMOS transistor comprising drain, source and floating gate electrodes, said drain electrode being coupled to said data input, said source and floating gate electrodes being coupled to said control circuitry.

16. In a volatile memory comprising a data input, volatile storage means for storing Q and $\overline{Q}$ output signals, and Q and $\overline{Q}$ data outputs, wherein the improvement comprises:
non-volatile memory means comprising a FATMOS transistor and control circuitry coupled thereto, for selectively storing a predetermined one of said Q and $\overline{Q}$ output signals, and for selectively transferring said stored signal to said volatile memory, said non-volatile memory means further comprising transistor means coupled to a voltage source and the drain electrode of said FATMOS transistor for selectively controlling the storage and transfer of signals between said non-volatile memory means and said volatile memory.

17. The memory of claim 16 wherein said transistor means comprises:
first and second transistor means serially coupled between said voltage source and said FATMOS transistor, said first transistor means being adapted to selectively charge the drain of said FATMOS transistor to a high level in order to permit the transfer of said stored signals to said volatile memory, said second transistor means being adapted to selectively transfer said stored signals to said volatile memory in conjunction with the charging of said first transistor means in response to the application of a READ control voltage applied thereto.

18. The memory of claim 17 wherein said control circuitry comprises:
a plurality of NAND gates having respective first inputs thereof coupled to said Q and $\overline{Q}$ data outputs and having respective second inputs thereof coupled to a WRITE control voltage, said NAND gates having outputs coupled to the gate and source electrodes of said FATMOS transistor, respectively.

* * * * *